(12) United States Patent
Pandey et al.

(10) Patent No.: US 9,142,280 B1
(45) Date of Patent: Sep. 22, 2015

(54) CIRCUIT FOR CONFIGURING EXTERNAL MEMORY

(71) Applicants: Rakesh Pandey, Ghaziabad (IN);
Bharat K. Kumbhkar, Paschim Vihar (IN); Biswaprakash Navajeevan, Noida (IN); Manmohan Rana, Ghaziabad (IN)

(72) Inventors: Rakesh Pandey, Ghaziabad (IN);
Bharat K. Kumbhkar, Paschim Vihar (IN); Biswaprakash Navajeevan, Noida (IN); Manmohan Rana, Ghaziabad (IN)

(73) Assignee: FREESCALE SEMICONDUCOTR, INC., Austin, TX (US)

( * ) Notice: Subject to any disclaimer, the term of this patent is extended or adjusted under 35 U.S.C. 154(b) by 0 days.

(21) Appl. No.: 14/452,536

(22) Filed: Aug. 6, 2014

(51) Int. Cl.
*G11C 7/00* (2006.01)
*G11C 11/406* (2006.01)
*G11C 11/4074* (2006.01)
*G11C 11/4093* (2006.01)
*G11C 11/4094* (2006.01)

(52) U.S. Cl.
CPC ...... *G11C 11/40615* (2013.01); *G11C 11/4074* (2013.01); *G11C 11/4093* (2013.01); *G11C 11/4094* (2013.01)

(58) Field of Classification Search
USPC .................................................. 365/189.11
See application file for complete search history.

(56) References Cited

U.S. PATENT DOCUMENTS

| 7,007,175 | B2 | 2/2006 | Chang | |
|---|---|---|---|---|
| 7,786,752 | B2 | 8/2010 | Oh | |
| 7,869,300 | B2 | 1/2011 | Bhakta | |
| 8,139,433 | B2 | 3/2012 | Sewall | |
| 2002/0008547 | A1* | 1/2002 | Shimano et al. | 326/112 |
| 2002/0144166 | A1 | 10/2002 | Chang | |
| 2010/0218025 | A1* | 8/2010 | Saito | 713/324 |
| 2011/0066798 | A1* | 3/2011 | Kaiwa et al. | 711/106 |
| 2012/0127817 | A1 | 5/2012 | Fujishiro | |

OTHER PUBLICATIONS

Texas Instruments, "DDR3 Design Requirements for KeyStone Devices", Application Report, SPRABI1B, May 2014.

\* cited by examiner

*Primary Examiner* — Hoai V Ho
*Assistant Examiner* — Pablo Huerta
(74) *Attorney, Agent, or Firm* — Charles Bergere

(57) ABSTRACT

A circuit for configuring an external memory includes a memory controller, a register, an OR gate, first and second input/output (IO) pads, and pull-up and pull-down resistors. When the circuit is in a high power mode, the memory controller refreshes the external memory by providing reset and clock enable signals to the external memory by way of the first and second IO pads. When the circuit is in a low power mode, the pull-up and pull-down resistors configure the external memory in a self-refresh mode. When the circuit exits the low power mode, the first and second IO pads are powered on. The OR gate receives and provides a control signal output by the register to the external memory by way of the first IO pad, which keeps the external memory in the self-refresh mode.

20 Claims, 1 Drawing Sheet

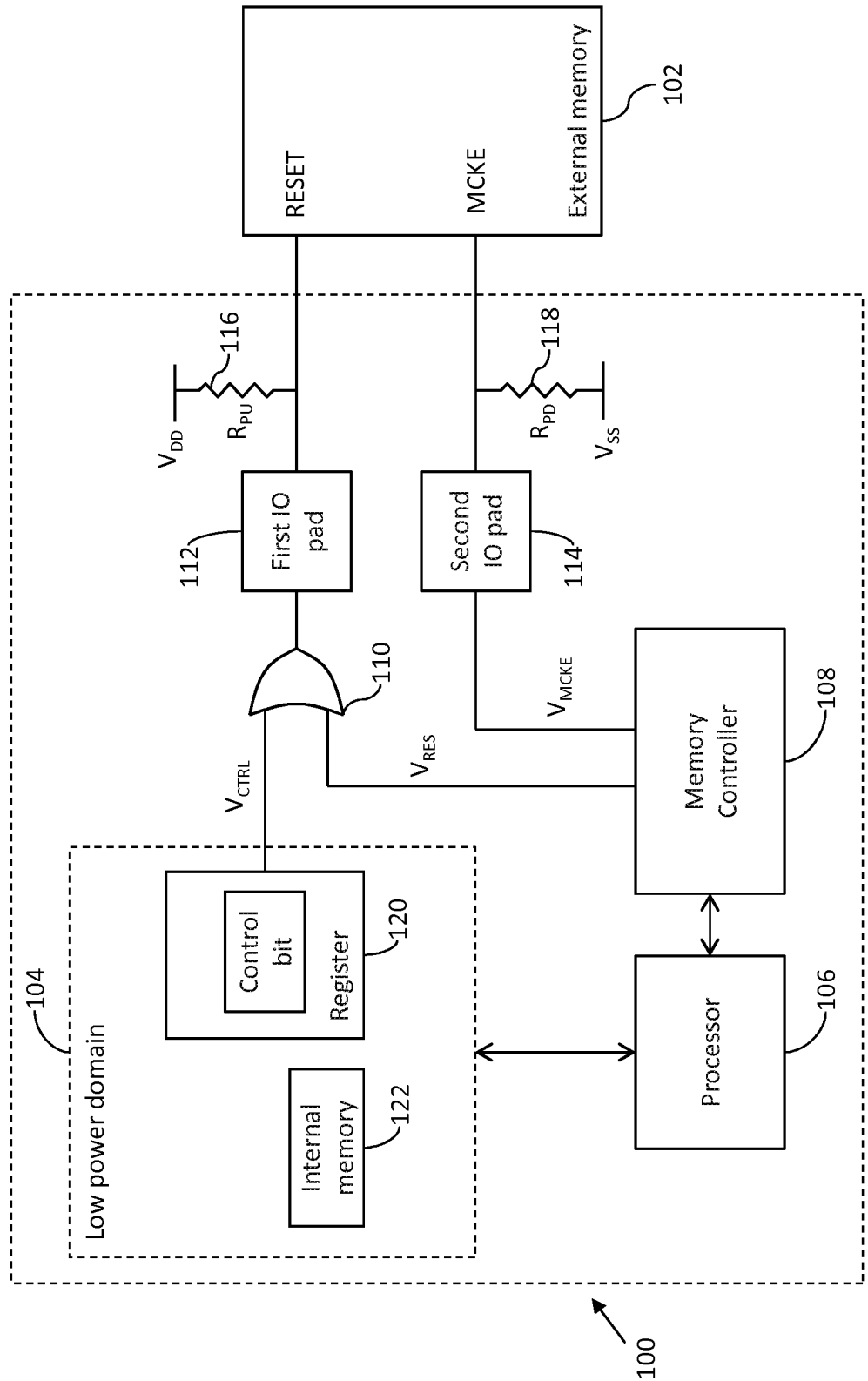

CIRCUIT FOR CONFIGURING EXTERNAL MEMORY

BACKGROUND OF THE INVENTION

The present invention relates generally to integrated circuits, and, more particularly, to an integrated circuit for configuring an external dynamic random access memory (DRAM).

Many integrated circuits (ICs) today include multiple components such as a processor and peripherals that are controlled by the processor. The peripherals include components such as memory controllers and a data bus. Such ICs are designed for specific applications such as those in automobiles and wireless communication devices. Based on the application, a processor of an IC executes a boot program that enables the IC to perform various functions that are programmed in an operating system (OS). The IC also includes an internal memory, such as a static random-access memory (SRAM) and a flash memory. The internal memory has a lower access time than external memories, such as dynamic random-access memory (DRAM) and programmable read-only memory (PROM). Hence, the internal memory is used to store data that is frequently accessed by the processor. Such data are also referred to as cache data. The external memories, which are external to the IC, have a larger capacity for storing data than the internal memories.

Internal memories are more expensive than external memories. Hence, to reduce the cost of the IC, the size of the internal memory is usually quite small. The OS is generally very large in size and exceeds the size of the internal memory. Hence, the OS is stored in an external memory.

A PROM is a non-volatile memory whereas a DRAM is a volatile memory. Thus, the PROMs are capable of persistent storage of data as compared to the DRAMs, and hence, the PROMs are suitable for storing the OS. However, the PROMs have a higher access time than the DRAMs and hence, the PROMs are unsuitable as a memory source for the processor to execute the OS from. To enable faster execution, all or part of the OS is copied from the PROM and stored in the DRAM.

The memory controller (i.e. a DRAM controller) enables the processor to access the DRAM. The DRAM controller receives instructions from the processor and sends commands to the DRAM by way of input/output (IO) pads to read and write data to/from the DRAM. However, since the DRAM is a volatile memory, the DRAM retains stored data for a short period of time. Thus, the DRAM must be constantly refreshed to enable persistent data storage. The DRAM operates in a refresh mode and a self-refresh mode. When the DRAM is in the refresh mode, the DRAM controller sends commands to the DRAM to refresh the DRAM at periodic time intervals. When the DRAM is in the self-refresh mode, the DRAM is capable of refreshing independent of the DRAM controller. To configure the DRAM in self-refresh mode, Joint Electron Device Engineering Council (JEDEC) standards require a DRAM RESET pin be at a logic high state and a clock enable (MCKE) pin of the DRAM to be at a logic low state. Generally, a RESET IO pad is used as an interface between the DRAM controller and the DRAM RESET pin and a MCKE IO pad is used as an interface between the DRAM controller and the DRAM MCKE pin. Thus, according to the JEDEC standards, when the DRAM is in self-refresh mode, the RESET and MCKE IO pads need to be kept high and low, respectively.

To reduce power consumption of the IC, the IC is operable in high and low power modes. When the IC is in the high power mode, the processor and the peripherals of the IC are operational. When the IC transitions from the high power mode to the low power mode, a state machine of the IC configures the processor and the peripherals in a sleep mode. In the sleep mode, the processor and the peripherals are either power-gated or clock-gated. When the IC transitions from low power mode to high power mode, the processor is powered on and starts executing OS instructions based on a boot vector stored in the internal memory. The boot vector is indicative of a stored state of the OS at which the IC transitions from the high to low power mode and enables the IC to resume operation from the stored state when the IC goes from the low power mode to the high power mode.

When the IC is in the high power mode, the DRAM controller refreshes the DRAM and enables persistent storage of the OS in the DRAM. When the IC transitions from the high power mode to the low power mode, it is desirable to power-gate the DRAM controller and the RESET and MCKE IO pads to reduce power consumption of the IC in the low power mode. Further, to reduce the transition time required for the IC to transition from the low power mode to the high power mode, it is desirable to keep the OS in the DRAM to save the time required to copy the OS from the PROM to the DRAM. Hence, it is desirable to configure the DRAM in the self-refresh mode to enable retention of the OS in the DRAM when the IC is in the low power mode. However, the DRAM controller is required to maintain the logic states of the RESET and MCKE pins of the DRAM. Thus, the DRAM controller and the RESET and MCKE IO pads need to be powered when the IC is in the low power mode, which increases power consumption.

A known technique to overcome this problem is to tie the DRAM MCKE pin to a termination voltage and connect the DRAM RESET pin to a reset controller. However, an additional power management IC (PMIC) is required to control the termination voltage. Further, the addition of the PMIC and the reset controller increases the area overhead and power consumption of the IC.

Therefore it would be advantageous to have an IC that can configure an external memory in a self-refresh mode without the need for a memory controller or IO pads, and reduces power consumption of the IC, reduces the transition time required for the IC to go from low power mode to high power mode without increasing the area overhead of the IC.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 1 is a schematic circuit diagram of an integrated circuit for configuring an external memory in accordance with an embodiment of the present invention.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit operable in high and low power modes is provided. The integrated circuit is connected to an external memory. The external memory stores a boot program to be executed by the integrated circuit. The integrated circuit includes a processor, a memory controller, first and second input/output (IO) pads, and pull-up and pull-down resistors. The processor generates a memory refresh command when the integrated circuit is in the high power mode, generates a memory self-refresh command when the integrated circuit transitions from the high power mode to the low power mode, and is powered off when the integrated circuit is in the low power mode. The memory controller is connected to the processor. The memory controller receives the memory refresh command and generates reset and clock enable signals when the integrated circuit is in the high power mode, receives the memory self-refresh command and generates the reset signal when the integrated circuit transitions from the high power mode to the low power mode, and is powered off when the integrated circuit is in the low power mode. The first IO pad is connected between the memory controller and the external memory. The first IO pad receives and outputs the reset signal when the integrated circuit is in the high power mode, and is powered off when the integrated circuit is in the low power mode. The second IO pad is connected between the memory controller and the external memory. The second IO pad receives and outputs the clock enable signal when the integrated circuit is in the high power mode, and is powered off when the integrated circuit is in the low power mode. Thus, the external memory receives the reset and clock enable signals and operates in a refresh mode when the integrated circuit is in the high power mode. The pull-up resistor is connected between the first IO pad and a first supply voltage. The pull-up resistor pulls up a voltage at an output of the first IO pad to a first supply voltage level when the integrated circuit is in the low power mode. The pull-down resistor is connected between the second IO pad and ground. The pull-down resistor pulls down a voltage at an output of the second IO pad to a ground voltage level when the integrated circuit is in the low power mode. Thus, the external memory is configured in a self-refresh mode when the integrated circuit is in the low power mode.

In another embodiment of the present invention, an integrated circuit operable in high and low power modes is provided. The integrated circuit is connected to an external memory. The external memory stores a boot program to be executed by the integrated circuit. The integrated circuit includes a processor, a memory controller, a register, an OR gate, first and second input/output (IO) pads, and pull-up and pull-down resistors. The processor generates a memory refresh command when the integrated circuit is in the high power mode, generates a memory self-refresh command when the integrated circuit transitions from the high power mode to the low power mode, and is powered off when the integrated circuit is in the low power mode. The memory controller is connected to the processor. The memory controller receives the memory refresh command and generates reset and clock enable signals when the integrated circuit is in the high power mode, receives the memory self-refresh command and generates the reset signal when the integrated circuit transitions from the high power mode to the low power mode, and is powered off when the integrated circuit is in the low power mode. The register stores a control bit and outputs a control signal when the integrated circuit transitions from the low power mode to the high power mode, and is disabled when the integrated circuit is in the high power mode. The OR gate is connected to the memory controller for receiving the reset signal and the register for receiving the control signal. The OR gate outputs the reset signal when the integrated circuit is in the high power mode and outputs the control signal when the integrated circuit transitions from the low power mode to the high power mode. The first IO pad is connected between the OR gate and the external memory. The first IO pad receives and outputs the reset signal when the integrated circuit is in the high power mode, receives and outputs the control signal when the integrated circuit transitions from the low power mode to the high power mode, and is powered off when the integrated circuit is in the low power mode. The second IO pad is connected between the memory controller and the external memory. The second IO pad receives and outputs the clock enable signal when the integrated circuit is in the high power mode, and is powered off when the integrated circuit is in the low power mode. Thus, the external memory receives the reset and the clock enable signals and operates in a refresh mode when the integrated circuit is in the high power mode. The pull-up resistor is connected between the first IO pad and a first supply voltage. The pull-up resistor pulls up a voltage at an output of the first IO pad to a first voltage level when the integrated circuit is in the low power mode. The pull-down resistor is connected between the second IO pad and ground. The pull-down resistor pulls down a voltage at an output of the second IO pad to a ground voltage level when the integrated circuit is in the low power mode. Thus, the external memory is configured in a self-refresh mode when the integrated circuit is in the low power mode.

Various embodiments of the present invention provide an integrated circuit operable in high and low power modes. The integrated circuit is connected to an external memory such as a DRAM. The DRAM stores a boot program to be executed by the integrated circuit. The integrated circuit, which may be a system-on-a-chip (SoC) includes a processor, a memory controller (also referred to as a DRAM controller), first and second input/output (IO) pads, and pull-up and pull-down resistors. The processor generates a memory refresh command when the integrated circuit is in the high power mode, generates a memory self-refresh command when the integrated circuit transitions from the high power mode to the low power mode, and is powered off when the integrated circuit is in the low power mode. The DRAM controller receives the memory refresh command and generates reset and clock enable signals when the integrated circuit is in the high power mode, receives the memory self-refresh command and generates the reset signal when the integrated circuit transitions from the high power mode to the low power mode, and is powered off when the integrated circuit is in the low power mode. The first IO pad (also referred to as the RESET IO pad) receives and outputs the reset signal when the integrated circuit is in the high power mode, and is powered off when the integrated circuit is in the low power mode. The second IO pad (also referred to as the MCKE IO pad) receives and outputs the clock enable signal when the integrated circuit is in the high power mode, and is powered off when the integrated circuit is in the low power mode. The pull-up resistor pulls up a voltage at an output of the RESET IO pad to a first supply voltage level when the integrated circuit is in the low power mode. The pull-down resistor pulls down a voltage at an output of the MCKE IO pad to a ground voltage level when the integrated circuit is in the low power mode. Thus, the DRAM is configured in a self-refresh mode when the integrated circuit is in the low power mode. The integrated circuit configures the DRAM in the self-refresh mode without using the DRAM controller or the RESET and MCKE IO pads. The DRAM controller and the RESET and MCKE IO pads are powered off when the integrated circuit is in the low power mode, and hence reduces power consumption of the integrated circuit. Since the DRAM is in the self-refresh mode and retains the operating system when the integrated circuit is in the low power mode, the transition time required for the integrated circuit to transition from the low power mode to the high power mode and execute the operating system is reduced without increasing the area overhead of the IC.

Referring now to FIG. 1, a schematic circuit diagram of an integrated circuit (IC) 100 for configuring an external memory 102 in accordance with an embodiment of the present invention is shown. The IC 100 is operable in high and low power modes. The IC 100 is designed to perform various functions such as playing a radio, displaying live video received from an external camera sensor (not shown) on a multi-information display (not shown) and controlling components external to the IC 100 such as power-windows (not shown). The aforementioned functions are executed by an operating system and applications programs that are stored in in the external memory 102. The external memory 102 may also store all or part of a boot program, but it is preferred that part of the boot program or a boot loader be stored in an internal memory (ROM or SRAM). The external memory 102 is operable in refresh and self-refresh modes to refresh the external memory 102, thereby enabling persistent storage of any data stored in the external memory 102. The external memory 102 includes RESET and MCKE pins that are used to configure the external memory 102 in the refresh and self-refresh modes. In an embodiment of the present invention, the external memory 102 is a dynamic random access memory (DRAM).

The IC 100 includes a low power domain 104, processor 106, a memory controller 108, an OR gate 110, first and second input/output (IO) pads 112 and 114, and pull-up and pull-down resistors 116 and 118.

The low power domain 104 includes components of the IC 100 that are powered when the IC 100 is in the high and low power modes. The low power domain 104 includes a register 120 and an internal memory 122. The register 120 stores a control bit and outputs a control signal ($V_{CTRL}$) based on the logic state of the control bit. The internal memory 122 stores a configuration data of the memory controller 108 when the IC 100 is in the low power mode. Since the register 120 and the internal memory 122 are powered when the IC 100 is in the low power mode, the register 120 and the internal memory 122 retain the logic state of the control bit and the configuration data, respectively.

The processor 106 is connected between the low power domain 104 and the memory controller 108. The processor 106 accesses the operating system stored in the external memory 102 by way of the memory controller 108 and executes the operating system when the IC 100 is in the high power mode. To enable persistent storage of the operating system on the external memory 102, the processor 106 generates and transmits refresh and self-refresh commands to the memory controller 108 to initiate the configuration of the external memory 102 in the refresh and self-refresh modes, respectively. When the IC 100 transitions from the high power mode to the low power mode, the processor 106 sets the control bit (i.e., stores the control bit at logic high state) of the register 120 to indicate the transition of the IC 100 to the low power mode. The processor 106 further retrieves the configuration data of the memory controller 108 and stores the configuration data in the internal memory 122. The configuration data of the memory controller 108 is indicative of a state and a status information of the external memory 102. The processor 106 is powered down when the IC 100 is in the low power mode. When the IC 100 exits the low power mode, the processor 106 is powered on. When the IC 100 transitions from the low power mode to the high power mode, the processor 106 further retrieves the configuration data from the internal memory 122 and provides the configuration data to the memory controller 108. When the IC 100 is the high power mode, the processor 106 clears the control bit of the register 120.

The memory controller 108 is connected to the processor 106 for receiving the refresh and self-refresh commands. When the refresh command is received, the memory controller 108 generates reset ($V_{RES}$) and clock enable signals ($V_{MCKE}$) at logic high states to configure the external memory 102 in the refresh mode. When the self-refresh command is received, the memory controller 108 generates the reset signal ($V_{RES}$) at logic high state and the clock enable signal ($V_{MCKE}$) at logic low state to configure the external memory 102 in the self-refresh mode. The memory controller 108 is powered off when the IC 100 is in the low power mode. When the IC 100 exits the low power mode, the memory controller 108 is powered on and generates the reset ($V_{RES}$) and clock enable signals ($V_{MCKE}$) at logic low states. When the IC 100 transitions to the high power mode, the memory controller 108 receives the configuration data from the processor 106 and initializes the external memory 102 based on the configuration data. In an embodiment of the present invention, the memory controller 108 is a double-data rate (DDR) memory controller.

The OR gate 110 has a first input terminal connected to the register 120 for receiving the control signal ($V_{CTRL}$) and a second input terminal connected to the memory controller 108 for receiving the reset signal ($V_{RES}$). The OR gate 110 outputs at least one of the control ($V_{CTRL}$) and reset ($V_{RES}$) signals at an output terminal thereof. When the IC 100 is in the high power mode, the OR gate 110 outputs the reset signal ($V_{RES}$). When the IC 100 transitions from the high power mode to the low power mode, the OR gate 110 outputs the reset signal ($V_{RES}$). When the IC 100 is in the low power mode, a supply voltage (not shown) to the OR gate 110 is power-gated and hence, the output of the OR gate 110 is indeterminate. When the IC 100 exits the low power mode and transitions to the high power mode, the OR gate 110 is powered on and outputs the control signal ($V_{CTRL}$).

The first IO pad 112 (hereinafter referred to as "RESET IO pad") has an input terminal connected to the output terminal of the OR gate 110 for receiving at least one of the control ($V_{CTRL}$) and reset ($V_{RES}$) signals and an output terminal connected to the RESET pin of the external memory 102 for providing at least one of the control ($V_{CTRL}$) and reset ($V_{RES}$) signals. When the IC 100 is in the low power mode, the RESET IO pad 112 is powered off and the output terminal of the RESET IO pad 112 is at high impedance.

The second IO pad 114 (hereinafter referred to as "MCKE IO pad") has an input terminal connected to the memory controller 108 for receiving the clock enable signal ($V_{MCKE}$) and an output terminal connected to the MCKE pin of the external memory 102 for providing the clock enable signal ($V_{MCKE}$). When the IC 100 is in the low power mode, the MCKE IO pad 114 is powered off and the output terminal of the MCKE IO pad 114 is at high impedance.

The pull-up resistor 116 is connected between the output terminal of the RESET IO pad 112 and a first supply voltage ($V_{DD}$). When the IC 100 is in the low power mode, the output terminal of the RESET IO pad 112 is at high impedance and hence, the pull-up resistor 116 pulls up a voltage at the output terminal of the RESET IO pad 112 to a first voltage level of the first supply voltage ($V_{DD}$).

The pull-down resistor 118 is connected between the output terminal of the MCKE IO pad 114 and ground ($V_{SS}$). When the IC 100 is in the low power mode, the output terminal of the MCKE IO pad 114 is at high impedance and hence, the pull-down resistor 118 pulls down a voltage at the output terminal of the MCKE IO pad 114 to a ground voltage level of the ground ($V_{SS}$).

In operation, when the IC 100 is in the high power mode and the external memory 102 needs to be refreshed, the processor 106 generates the refresh command to initiate configuration of the external memory 102 in the refresh mode. The memory controller 108 receives the refresh command from the processor 106 and generates the reset ($V_{RES}$) and clock enable signals ($V_{MCKE}$) at logic high states. The OR gate 110 receives and provides the logic high reset signal ($V_{RES}$) to the RESET IO pad 112. The RESET IO pad 112 receives and provides the logic high reset signal ($V_{RES}$) to the RESET pin of the external memory 102. The MCKE IO pad 114 receives and provides the logic high clock enable signal ($V_{MCKE}$) to the MCKE pin of the external memory 102. Thus, the external memory 102 is configured in the refresh mode when the IC 100 is in the high power mode.

When the IC 100 transitions from the high power mode to the low power mode, the processor 106 generates the self-refresh command to initiate configuration of the external memory 102 in the self-refresh mode and enable the retention of the operating system in the external memory 102. The processor 106 further sets the control bit of the register 120 at logic high state. The memory controller 108 receives the self-refresh command from the processor 106 and generates the reset signal ($V_{RES}$) at logic high state and the clock enable signal ($V_{MCKE}$) at logic low state. The OR gate 110 receives and provides the logic high reset signal ($V_{RES}$) to the RESET IO pad 112. The RESET IO pad 112 receives and provides the logic high reset signal ($V_{RES}$) to the RESET pin of the external memory 102. The MCKE IO pad 114 receives and provides the logic low clock enable signal ($V_{MCKE}$) to the MCKE pin of the external memory 102. Thus, the external memory 102 is configured in the self-refresh mode when the IC 100 transitions from the high power mode to the low power mode.

When the IC 100 is in the low power mode, the processor 106, the memory controller 108, the OR gate 110, and the RESET and MCKE IO pads 112 and 114 are power-gated. Hence, the output terminals of the RESET and MCKE IO pads 112 and 114 are at high impedance. The pull-up resistor 116 pulls-up the RESET pin of the external memory 102 to the first voltage level of the first supply voltage ($V_{DD}$) indicative of logic high state. The pull-down resistor 118 pulls-down the MCKE pin of the external memory 102 to the ground voltage level of the ground ($V_{SS}$) indicative of logic low state. Thus, the external memory 102 is configured in the self-refresh mode when the IC 100 is in the low power mode. Since, the IC 100 configures the external memory 102 in the self-refresh mode without using the processor 106, memory controller 108, and the RESET and MCKE IO pads 116 and 118, the power consumption of the IC 100 is reduced when the IC 100 is in the low power mode.

When the IC 100 transitions from the low power mode to the high power mode, the processor 106, the memory controller 108, the OR gate 110, and the RESET and MCKE IO pads 112 and 114 are powered on. The memory controller 108 generates the reset ($V_{RES}$) and clock enable signals ($V_{MCKE}$) at logic low states. The OR gate 110 receives the logic low reset signal ($V_{RES}$) and the logic high control signal ($V_{CTRL}$) and provides the logic high control signal ($V_{CTRL}$) to the RESET IO pad 112. The RESET IO pad 112 receives and provides the logic high control signal ($V_{CTRL}$) to the RESET pin of the external memory 102. The MCKE IO pad 114 receives and provides the logic low clock enable signal ($V_{MCKE}$) to the MCKE pin of the external memory 102. Thus, the external memory 102 remains configured in the self-refresh mode when the IC 100 transitions from the low power mode to the high power mode. Since the external memory 102 remains in the self-refresh mode and retains the operating system when the IC 100 is in the low power mode and transitions to the high power mode, the transition time required for the IC 100 to transition from the low power mode to the high power mode and enable the processor 106 to execute the operating system is reduced. Further, the addition of small components such as the OR gate 110 and the pull-up and pull-down resistors 116 and 118 do not increase the area overhead of the IC 100.

When the IC 100 is in the high power mode after transitioning from the low power mode, the processor 106 retrieves the configuration data from the internal memory 122 and provides the configuration data to the memory controller 108. The memory controller 108 receives the configuration data and initializes the external memory 102 based on the configuration data. The processor 106 clears the control bit of the register 120. The processor 106 further issues a refresh exit command to the memory controller 108 for initiating the exit of the external memory 102 from the self-refresh mode. The memory controller 108 generates the reset ($V_{RES}$) and clock enable signals ($V_{MCKE}$) based on the refresh exit command and enables the external memory 102 to exit the self-refresh mode.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit (IC), operable in high and low power modes, connected to an external memory that stores a boot program to be executed by the integrated circuit, the integrated circuit comprising:

a processor that generates a memory refresh command when the IC is in the high power mode, generates a memory self-refresh command when the IC transitions from the high power mode to the low power mode, and is powered off when the IC is in the low power mode;

a memory controller, connected to the processor, that receives the memory refresh command and generates reset and clock enable signals when the IC is in the high power mode, receives the memory self-refresh command and generates the reset signal when the IC transitions from the high power mode to the low power mode, and is powered off when the IC is in the low power mode;

a first input/output (IO) pad, connected between the memory controller and the external memory, that receives and outputs the reset signal when the IC is in the high power mode, and is powered off when the IC is in the low power mode;

a second input/output (IO) pad, connected between the memory controller and the external memory, that receives and outputs the clock enable signal when the IC is in the high power mode, and is powered off when the IC is in the low power mode, whereby the external memory receives the reset and the clock enable signals and operates in a refresh mode when the IC is in the high power mode;

a pull-up resistor, connected between the first IO pad and a first supply voltage, that pulls up a voltage at an output of the first IO pad to a first supply voltage level when the IC is in the low power mode; and a pull-down resistor, connected between the second IO pad and ground, that pulls down a voltage at an output of the second IO pad to a ground voltage level when the IC is in the low power mode, thereby configuring the external memory in a self-refresh mode when the IC is in the low power mode.

2. The IC of claim 1, wherein the processor, the memory controller, and the first and second IO pads are powered on when the IC transitions from the low power mode to the high power mode.

3. The IC of claim 1, further comprising a register that stores a control bit and outputs a control signal when the IC transitions from the low power mode to the high power mode, wherein the control bit is disabled when the IC is in the high power mode.

4. The IC of claim 3, further comprising an OR gate, connected to the memory controller and the register for receiving the reset and control signals, respectively, and connected to the first IO pad, wherein the OR gate outputs the reset signal to the first IO pad when the IC is in the high power mode, outputs the reset signal to the first IO pad when the IC transitions from the high power mode to the low power mode, and outputs the control signal to the first IO pad when the IC transitions from the low power mode to the high power mode.

5. The integrated circuit of claim 4, wherein the first IO pad further receives and outputs the reset signal when the IC transitions from the high power mode to the low power mode, whereby the external memory receives the reset signal and operates in the self-refresh mode when the IC transitions from the high power mode to the low power mode.

6. The IC of claim 4, wherein the first IO pad further receives and outputs the control signal when the IC transitions from the low power mode to the high power mode, whereby the external memory receives the control signal and operates in the self-refresh mode when the IC transitions from the low power mode to the high power mode.

7. The IC of claim 4, further comprising an internal memory that stores memory controller configuration data when the IC circuit is in the low power mode.

8. The IC of claim 7, wherein the processor fetches the configuration data from the internal memory and provides the configuration data to the memory controller when the IC transitions from the low power mode to the high power mode.

9. The IC of claim 4, wherein the memory controller is a double-data rate (DDR) memory controller.

10. The IC of claim 9, wherein the external memory is a dynamic random access memory (DRAM).

11. The IC of claim 10, wherein the first IO pad provides at least one of the reset and control signals to a RESET pin of the external memory, and the second IO pad provides the clock enable signal to an MCKE pin of the external memory.

12. An integrated circuit (IC), operable in high and low power modes, and connected to an external memory, wherein the external memory stores a boot program to be executed by the integrated circuit, the IC comprising:

a processor, that generates a memory refresh command when the IC is in the high power mode, generates a memory self-refresh command when the IC transitions from the high power mode to the low power mode, and is powered off when the IC is in the low power mode;

a memory controller, connected to the processor, that receives the memory refresh command and generates reset and clock enable signals when the IC is in the high power mode, receives the memory self-refresh command and generates the reset signal when the IC transitions from the high power mode to the low power mode, and is powered off when the IC is in the low power mode;

a register, that stores a control bit and outputs a control signal when the IC transitions from the low power mode to the high power mode, and is disabled when the IC is in the high power mode;

an OR gate, connected to the memory controller for receiving the reset signal and the register for receiving the control signal, that outputs the reset signal when the IC is in the high power mode and outputs the control signal when the IC transitions from the low power mode to the high power mode;

a first input/output (IO) pad, connected between the OR gate and the external memory, that receives and outputs the reset signal when the IC is in the high power mode, receives and outputs the control signal when the IC transitions from the low power mode to the high power mode, and is powered off when the IC is in the low power mode;

a second input/output (IO) pad, connected between the memory controller and the external memory, that receives and outputs the clock enable signal when the IC is in the high power mode, and is powered off when the IC is in the low power mode, whereby the external memory receives the reset and the clock enable signals and operates in a refresh mode when the IC is in the high power mode;

a pull-up resistor, connected between the first IO pad and a first supply voltage, that pulls up a voltage at an output of the first IO pad to a first voltage level when the IC is in the low power mode; and a pull-down resistor, connected between the second IO pad and ground, that pulls down a voltage at an output of the second IO pad to a ground voltage level when the IC is in the low power mode, thereby configuring the external memory in a self-refresh mode when the IC is in the low power mode.

13. The IC of claim 12, wherein the first IO pad outputs the control signal to the external memory when the IC transitions from the low power mode to the high power mode, whereby the external memory receives the control signal and operates in the self-refresh mode when the IC transitions from the low power mode to the high power mode.

14. The IC of claim 12, wherein the OR gate outputs the reset signal when the IC transitions from the high power mode to the low power mode.

15. The IC of claim 14, wherein the first IO pad further receives and outputs the reset signal when the IC transitions from the high power mode to the low power mode, whereby the external memory receives the reset signal and operates in the self-refresh mode when the IC transitions from the high power mode to the low power mode.

16. The IC of claim 12, further comprising an internal memory that stores memory controller configuration data when the IC is in the low power mode.

17. The IC of claim 16, wherein the processor fetches the configuration data from the internal memory and provides the configuration data to the memory controller when the IC transitions from the low power mode to the high power mode.

18. The IC of claim 12, wherein the memory controller is a double-data rate (DDR) memory controller.

19. The IC of claim 18, wherein the external memory is a dynamic random access memory (DRAM).

20. The IC of claim 19, wherein the first IO pad provides at least one of the reset and control signals to a RESET pin of the external memory, and the second IO pad provides the clock enable signal to an MCKE pin of the external memory.

* * * * *